United States Patent
Qian et al.

(10) Patent No.: US 7,742,556 B1
(45) Date of Patent: Jun. 22, 2010

(54) CIRCUITS, METHODS, APPARATUS, AND SYSTEMS FOR RECOVERY OF SPREAD SPECTRUM CLOCK

(75) Inventors: Haoli Qian, Sunnyvale, CA (US); Runsheng He, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 1125 days.

(21) Appl. No.: 11/376,601

(22) Filed: Mar. 14, 2006

Related U.S. Application Data

(60) Provisional application No. 60/716,703, filed on Sep. 13, 2005.

(51) Int. Cl.
*H03D 3/24* (2006.01)

(52) U.S. Cl. ............ 376/376; 375/377; 375/374; 375/327; 375/149; 375/145; 369/30.08; 369/131

(58) Field of Classification Search ............ 375/137, 375/145, 149, 327, 374, 376, 377; 327/141, 327/148; 369/30.08, 131; 720/668, 690, 720/746; 714/48, 49, 57, 701, 705, 798, 714/799

See application file for complete search history.

(56) References Cited

U.S. PATENT DOCUMENTS

| | | | | |
|---|---|---|---|---|
| 4,989,219 | A * | 1/1991 | Gerdes et al. ............ | 375/286 |
| 5,488,627 | A * | 1/1996 | Hardin et al. ............ | 375/139 |
| 6,563,857 | B1 | 5/2003 | Shi et al. | |
| 6,687,319 | B1 * | 2/2004 | Perino et al. ............ | 375/367 |
| 7,394,885 | B2 * | 7/2008 | Giunco et al. ............ | 375/376 |
| 2001/0017557 | A1 * | 8/2001 | Friedrich et al. ......... | 327/155 |
| 2002/0109537 | A1 * | 8/2002 | Lee .......................... | 327/156 |
| 2003/0043896 | A1 * | 3/2003 | Proidl ..................... | 375/224 |
| 2003/0197565 | A1 * | 10/2003 | Tan et al. .................. | 331/17 |
| 2004/0058662 | A1 * | 3/2004 | Gieske et al. ............ | 455/313 |
| 2006/0033582 | A1 * | 2/2006 | Staszewski et al. ....... | 331/16 |

OTHER PUBLICATIONS

I-Teh Sha, Kuang-Yu Chen, Albert Chen and Jeff Keip; An Adaptive Spread-Spectrum Clock Generator; RF Design; Aug. 1, 2001; 5 Pages.; Prima Business Magazine & Media Inc., 2006.

John Fessler; Spread Spectrum Clock Generator Technology; Lexmark International, Inc.; 2 Pages.; http://www.lexmark.com/sscg.

Hsiang-Hui Chang, I-Hui Hua and Shen-Iuan Liu; A Spread-Spectrum Clock Generator with Triangular Modulation; IEEE Journal of Solid-State Circuits; Apr. 2003; pp. 673-676; vol. 38, No. 4; 2003 IEEE.

(Continued)

*Primary Examiner*—David C. Payne
*Assistant Examiner*—Rahel Guarino

(57) ABSTRACT

Circuits, methods, apparatus, and systems for recovering a clock from a spread spectrum signal having a periodic modulation profile. The circuits generally include an error detector circuit configured to compare the spread spectrum signal and a recovered clock signal, and to produce a first error signal corresponding to the periodic modulation profile and a second error signal corresponding to phase differences other than the spread spectrum modulation, a record and playback unit configured to record a value to a frequency memory, said value based on the first error signal and produce a third error signal corresponding to a predicted periodic modulation based at least in part on the recorded value, and a signal generator configured to produce the recovered clock signal in response to the second and third error signals.

29 Claims, 11 Drawing Sheets

OTHER PUBLICATIONS

Keith B. Hardin, John T. Fessler and Donald R. Bush; Spread Spectrum Clock Generation for the Reduction of Radiated Emissions; 1994 IEEE, pp. 227-231; International Symposium on Electromagnetic Compatibility; Chicago, Aug. 22-26, 1994.

* cited by examiner

FIG. 3A (Background)
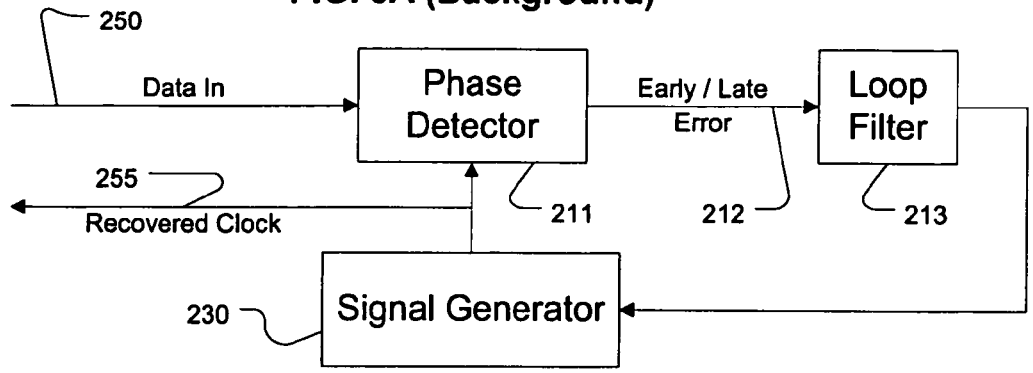
FIG. 3B (Background)
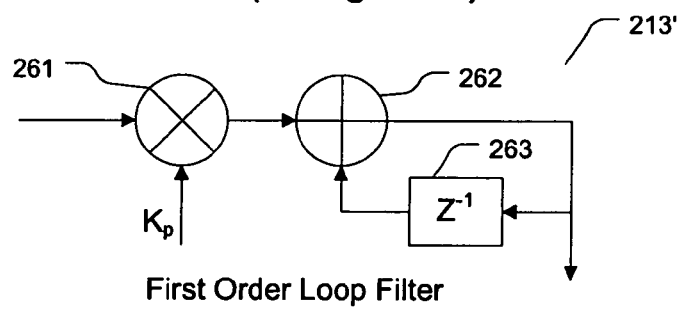
First Order Loop Filter
FIG. 3C (Background)
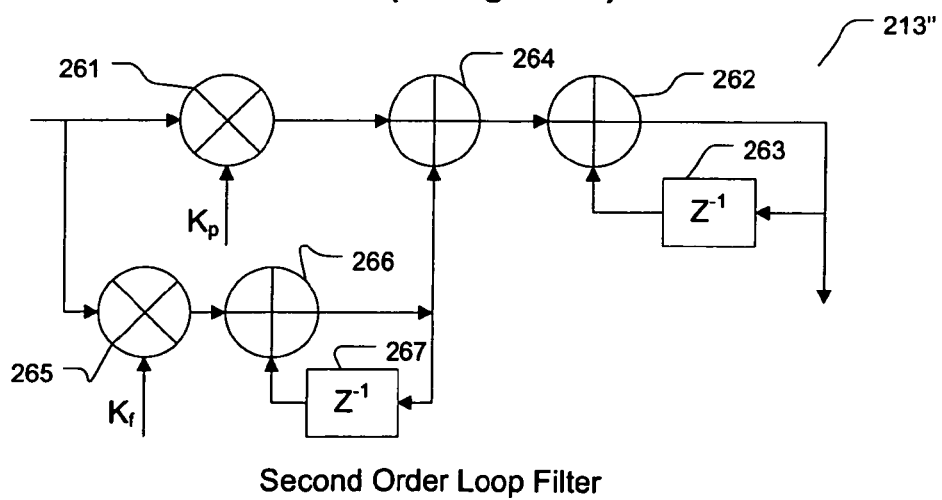
Second Order Loop Filter First Order Loop Filter Second Order Loop Filter

# CIRCUITS, METHODS, APPARATUS, AND SYSTEMS FOR RECOVERY OF SPREAD SPECTRUM CLOCK

RELATED APPLICATIONS

This application claims the benefit of U.S. Provisional Application No. 60/716,703, filed Sep. 13, 2005, incorporated herein by reference in its entirety.

FIELD OF THE INVENTION

The present invention generally relates to the field of clock recovery circuits. More specifically, embodiments of the present invention pertain to circuits, methods, apparatus, and systems for data communications in a network using clock recovery of spread spectrum signals.

DISCUSSION OF THE BACKGROUND

A clock and data recovery (CDR) loop is used to recover an embedded clock from an incoming data stream. In many communication systems, only a data signal is transmitted. The receivers in such systems must generally recover a clock signal from the data signal. Conventional CDR circuits are generally designed to recover a clock signal within a narrow, and generally constant, range of frequencies. However, spread spectrum clock (SSC) generation is being increasingly used in data communication. SSC is generally a form of frequency modulation. The instantaneous frequency may be represented as a function of time, and is usually a periodic function that may be characterized as a modulation profile.

Spectrum spreading is commonly used in radio frequency communication to facilitate high-resolution ranging, multiple access, jamming resistant waveforms, and energy density reduction. Spread spectrum clock generation has also been adopted in many high speed data communications standards, including the PCIe and SATA standards.

Spread spectrum clocking is particularly useful for reducing electromagnetic interference (EMI). Electronic devices typically generate electromagnetic interference (EMI) when operating. The EMI generated by one electronic device may adversely affect the operation of another electronic device. In order to minimize adverse effects of EMI on other electronic devices, regulatory agencies in many countries have adopted standards which limit the amount of energy an electronic device may radiate at any given frequency.

Electronic devices frequently use a clock signal of some frequency for operation. In many such devices, relatively long traces or wires are used to route the clock signal to various integrated circuit (IC) components. These long wires or traces can act as antennas which, in turn, radiate energy at the clock signal frequency and (in many cases) its harmonics. Since antennas radiate more efficiently as wavelength becomes smaller with respect to antenna length, the amount of energy so radiated increases as the clock frequency increases. Consequently, in sophisticated electronic devices such as, for instance, personal computers, printers, cellular phones and peripheral devices, where clock frequencies are approaching gigahertz speeds, EMI is increasingly problematic.

When substantially all of a clock's energy is at one frequency, EMI energy may exceed regulatory limits at that clock frequency. Referring now to FIG. 1A, EMI profile 101 shows the emissions of a device at a substantially constant clock speed. A well known technique to reduce the peak EMI energy at the clock frequency (and its harmonics) is to use spread spectrum clock generation techniques to spread the energy across a part of the frequency spectrum. EMI profile 102 shows the reduced maximum emissions for a device with a spread spectrum clock.

Different modulation profiles can be used to achieve spread spectrum clocking, with varying results in terms of emission profiles. Referring now to FIG. 1B, emission profile 111 shows the emissions resulting from a non-linear optimized modulation profile (e.g., the modulation profile shown in FIG. 2B). Emission profile 112 shows the emissions resulting from a triangular modulation profile (e.g., the modulation profile shown in FIG. 2A). Emission profile 113 shows the emissions resulting from a sinusoidal modulation profile. Other periodic waveforms may be chosen by different implementers. Furthermore, different modulation waveforms may result from imperfect implementations of SSC generators. Therefore it is desirable to recover clocks from signals where the modulation profile is unknown or imperfect.

Spread spectrum clocking introduces some difficulties for CDR loop design. As data rates increase, communications performance is increasingly impacted by jitter in the locally recovered clock signal. At the same time, inter-symbol interference (ISI) and cross talk may also increase as the data rate increases. The local CDR circuit generally receives a noisier signal, and significant instants (for example, the zero crossing points of the waveform) may be blurred or otherwise adversely impacted by this interference and cross talk.

Referring now to FIG. 3A, a conventional CDR loop is shown. Phase detector 211 compares spread spectrum input signal 250 to recovered clock signal 255 to produce an unfiltered error signal 212. Loop filter 213 filters the error signal to reduce jitter, and provides a filtered error signal to signal generator 230. Signal generator 230 then generates the recovered clock from to the filtered error signal and (typically) a reference clock signal (not shown).

The error signal generated by phase detector 211 is generally a noisy estimate of the phase error (e.g., the error signal may comprise a desired error term and a noise term). The loop filter processes the phase error signal in order to generate a useful error while suppressing the effect of the noise as much as possible.

The bandwidth of the loop filter generally determines the range of error signal frequencies that the loop filter will pass. The value of this bandwidth typically has a direct impact on the performance of the CDR. For example, if the value of the loop bandwidth is large, the loop filter can pass a wide range of frequencies for the error signal. A wide loop bandwidth may therefore allow the CDR to track out large frequency errors (e.g., errors due to spread spectrum modulation of the input signal and frequency difference between the transmitter and receiver clocks). However, a loop with a wide bandwidth will also pass a wider portion of the noise spectrum, resulting in a noisy control signal for the signal generator and causing large phase jitter on the recovered clock.

In contrast, a small value for the loop bandwidth may limit the amount of noise that passes through the filter. The narrow loop bandwidth will generally result in a cleaner control signal for the signal generator. However, the drawback of using a narrow loop bandwidth is that the range of frequencies that the CDR loop can track is limited, thereby reducing its applicability to spread spectrum signals.

Another important design criterion for the loop filter is the order of the filter. FIGS. 3B and 3C, show conventional first-order and second order loop filters. Trade-offs between the frequency tracking capability and the noise filtering performance of the first order loop are typically made by adjusting $K_p$ (e.g., at multiplier 261). SSC can make the first order loop unusable because of an unacceptably large frequency variation. When the frequency difference between transmitter clock and receiver clock is substantially constant, the second order loop generally separates frequency tracking and noise filtering by including a frequency loop (e.g., multiplier 265, adder 266 and delay 267). However, for SSC recovery where frequency varies in a periodic manner, the second order loop still suffers from tracking this frequency variation.

A need therefore exists for stable, reliable recovery of spread spectrum clock signals from spread spectrum data signals with good noise resistance at high data rates.

SUMMARY OF THE INVENTION

Embodiments of the present invention relate to circuitry, methods, apparatus, and systems for recovering a clock from a spread spectrum signal having a periodic modulation profile. The circuitry generally comprises (a) an error detector circuit configured to compare the spread spectrum data signal and a recovered clock signal, and to produce a first error signal corresponding to the spread spectrum modulation and a second error signal corresponding to phase differences other than the spread spectrum modulation, (b) a record and playback unit configured to record a value (e.g., an update value), where the recorded value is based on the first error signal and produce a third error signal corresponding to a predicted periodic modulation based on the recorded value, and (c) a signal generator configured to produce the recovered clock signal in response to the second and third error signals.

Alternatively, the circuit or apparatus may comprise (a) a means for comparing the spread spectrum signal to a recovered clock signal, (b) a means for producing a first error signal corresponding to the modulation profile and a second error signal corresponding to phase differences other than the modulation, (c) a means for recording a value (e.g., an update value), where the value is based on the first error signal and for producing a third error signal corresponding to a predicted periodic modulation based on the recorded signal, and (d) a means for generating the recovered clock signal in response to the second and third error signals. The systems generally comprise those that include a circuit embodying one or more of the inventive concepts disclosed herein.

The method generally includes the steps of (a) comparing the spread spectrum signal and a recovered clock signal to produce a first error signal corresponding to the modulation profile and a second error signal corresponding phase differences other than the modulation, (b) recording a value, where the value is based on the first error signal and producing a third error signal corresponding to a predicted periodic modulation based on the recorded value, and (c) producing the recovered clock signal in response to the second and third error signals.

Generally, embodiments of the present invention separate the periodic frequency variation pattern caused by spread spectrum modulation from the phase variations caused by other phase noises that conventional timing loops are designed to track. Thus, the present invention advantageously allows for narrowband filtering of conventional phase noise, providing good noise resistance at high data rates using conventional loop filter techniques, while accurately tracking phase and frequency changes due to spread spectrum modulation of the data signal frequency. Therefore the loop filter can be greatly simplified, because the large periodic phase variation caused by the spread spectrum frequency modulation is compensated by a separate signal path. Furthermore, implementations of the present invention do not require knowledge of the specific modulation profile used to modulate the spread spectrum input signal.

These and other advantages of the present invention will become readily apparent from the detailed description of preferred embodiments below.

BRIEF DESCRIPTION OF THE DRAWINGS

FIG. 3A is a diagram of a conventional CDR loop.

FIG. 3B is a diagram of a conventional first order loop filter.

FIG. 3C is a diagram of a conventional second order loop filter.

DETAILED DESCRIPTION OF THE PREFERRED EMBODIMENTS

Figure 1A:
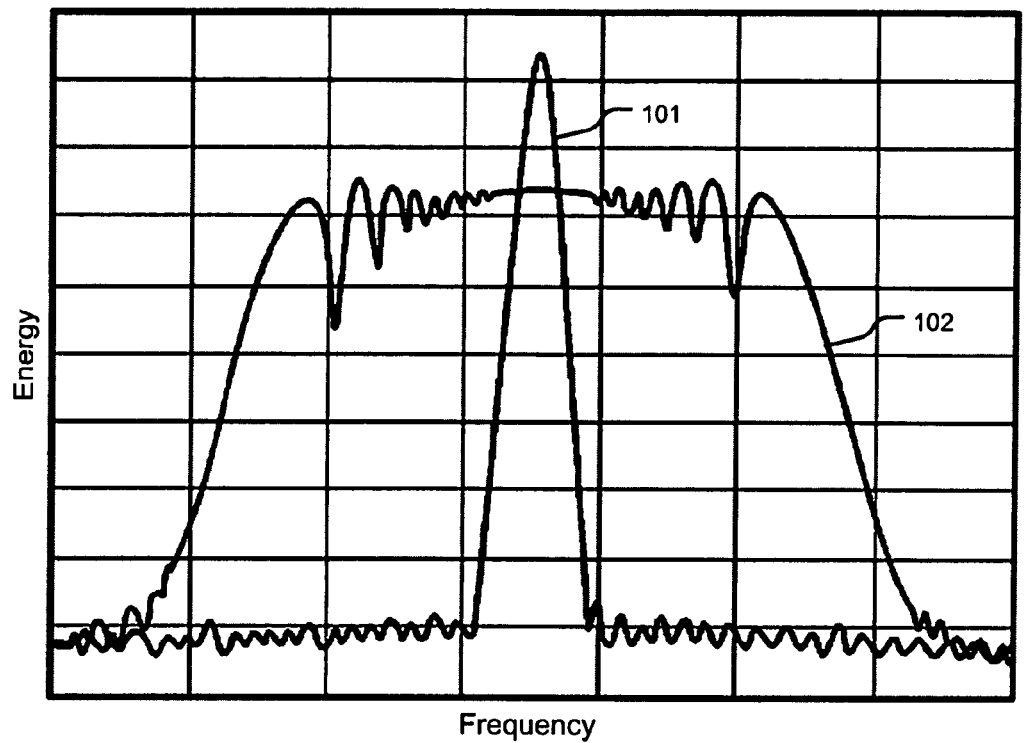
FIG. 1A is a graph showing electromagnetic emissions for conventional fixed frequency and spread spectrum signals.
Figure 1B:
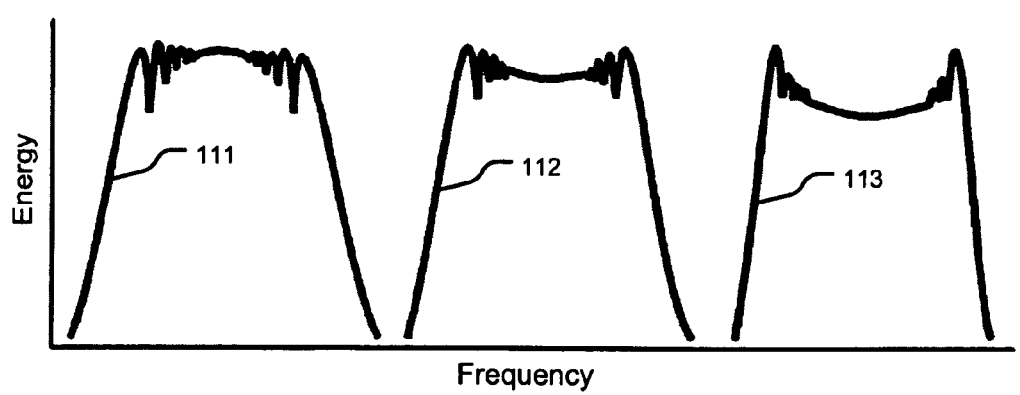
FIG. 1B is a graph showing electromagnetic emissions for a variety of conventional spread spectrum modulation profiles.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams, or waveforms within a computer, processor, controller, and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The present invention concerns circuitry, methods, apparatus, and systems for recovering a clock from a spread spectrum signal having a periodic modulation profile. The circuitry generally comprises (a) an error detector circuit configured to compare the spread spectrum signal and a recovered clock signal, and to produce a first error signal corresponding to the periodic modulation profile and a second error signal corresponding to phase differences other than the spread spectrum modulation, (b) a record and playback unit configured to record a value (e.g., an update value), where the value is based on the first error signal and produce a third error signal corresponding to a predicted periodic modulation based on the recorded signal, and (c) a signal generator configured to produce the recovered clock signal in response to the second and third error signals.

Alternatively, the circuit or apparatus may comprise (a) a means for comparing the spread spectrum signal to a recovered clock signal, (b) a means for producing a first error signal corresponding to the SSC modulation profile and a second error signal corresponding to phase differences other than the modulation, (c) a means for recording a value (e.g., an update value), where the value is based on the first error signal and for producing a third error signal corresponding to a predicted periodic modulation based on the recorded value, and (d) a means for generating the recovered clock signal in response to the second and third error signals. The systems generally comprise those that include a circuit embodying one or more of the inventive concepts disclosed herein.

The method generally include the steps of (a) comparing the spread spectrum signal and a recovered clock signal to produce a first error signal corresponding to the SSC modulation profile and a second error signal corresponding to phase differences other than the modulation, (b) recording a value based on the first error signal and producing a third error signal corresponding to a predicted periodic modulation based on the recorded value, and (c) producing the recovered clock signal in response to the second and third error signals.

The invention, in its various aspects, will be explained in greater detail below with regard to exemplary embodiments.

An Exemplary Circuit

In one aspect, the present invention relates to a circuit, comprising (a) an error detector circuit configured to compare the spread spectrum signal and a recovered clock signal, and to produce a first error signal corresponding to the SSC periodic modulation profile and a second error signal corresponding to phase differences other than the SSC modulation, (b) a record and playback unit configured to record a value (e.g., an update value), where the value is based on the first error signal and produce a third error signal corresponding to a predicted periodic modulation based on the recorded value, and (c) a signal generator configured to produce the recovered clock signal in response to the second and third error signals. Thus, the circuit or apparatus may comprise a means for comparing the phase of the spread spectrum signal to the phase of a recovered clock signal, a means for producing a first error signal corresponding to the SSC modulation profile and a second error signal corresponding to phase differences other than the modulation, a means for recording a value (e.g., an update value) based on the first error signal and for producing a third error signal corresponding to a predicted periodic modulation based on the recorded value, and a means for generating the recovered clock signal in response to the second and third error signals.

Figure 4:
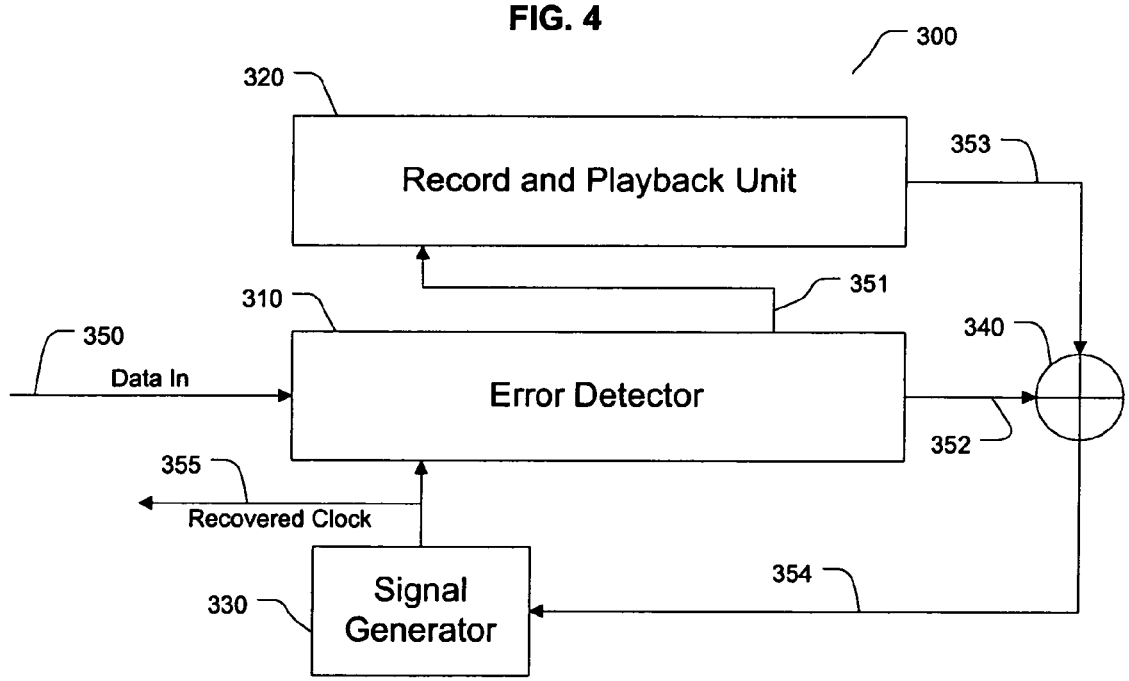
FIG. 4 is a simplified diagram of an exemplary CDR loop according to the present invention.

FIG. 4 shows a first exemplary embodiment of circuit 300, including error detector 310 configured to compare the phase of spread spectrum input signal 350 to the phase of recovered clock signal 355. Error detector 310 is generally configured to produce first error signal 351 corresponding to the periodic modulation profile and second error signal 352 corresponding to phase differences other than the spread spectrum modulation. Circuit 300 further includes a record and playback unit 320, configured to record a value to a frequency memory, where the value is based on first error signal 351 and to produce third error signal 353, corresponding to a predicted periodic modulation based on the recorded value. Finally, circuit 300 includes signal generator 330, configured to produce recovered clock signal 355 in response to second error signal 352 and third error signal 353.

Figure 2A:
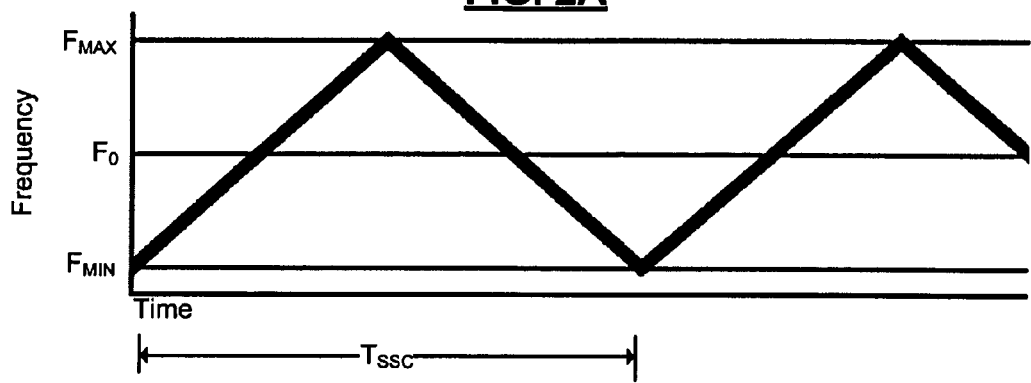
FIG. 2A is a graph showing a conventional triangular spread spectrum modulation profile.
Figure 2B:
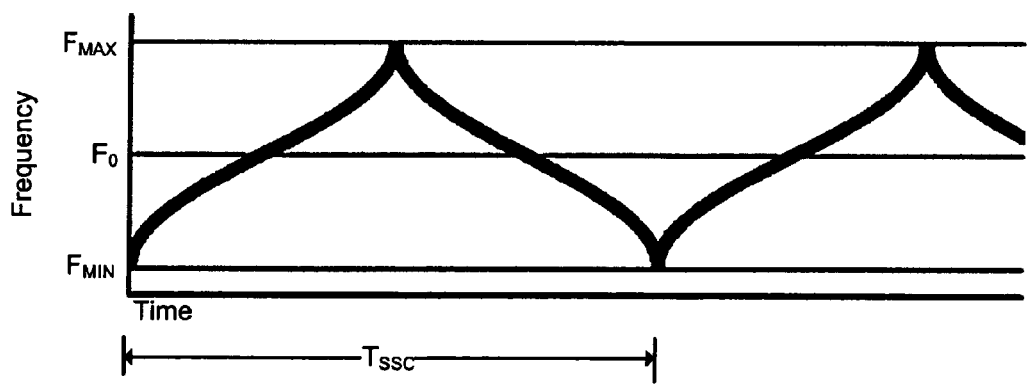
FIG. 2B is a graph showing a conventional nonlinear optimized spread spectrum modulation profile.

Spread spectrum input signal 350 generally has a frequency generated by modulating a center frequency ($f_0$) with a periodic modulation profile (e.g., the modulation profiles of FIGS. 2A-B). The instantaneous frequency of the spread spectrum signal as a function of time may be characterized by the equation:

$$f(t) = f_0 + \delta f * p(t); \quad (1)$$

where δf is the frequency deviation of the modulation waveform and p(t) is the normalized modulation profile. The modulation profile characterized by p(t) is generally periodic, with period $T_{SSC}$.

Error detector 310 generally detects phase and frequency deviations between spread spectrum input signal 350 and recovered clock signal 355. An error signal corresponding to those deviations may then be filtered (or possibly used in unfiltered form) to produce first error signal 351 corresponding to the periodic modulation profile (e.g., corresponding to δf*p(t) of Equation 1). The error signal may also be integrated to produce second error signal 352 corresponding to phase differences other than the spread spectrum modulation.

Record and playback unit 320 records a current estimate of the periodic modulation profile based on the update from first error signal 351. Generally, record and playback unit 320 will record the updated value N times over a period $T_{SSC}$ of the modulation profile (where N is a positive integer). After one or more repetitions of the modulation profile, the frequency memory will have saved a copy of the modulation profile. The modulation profile may be read or "played back" to produce third error signal 353, corresponding to a predicted periodic modulation.

In a further embodiment, the error detector circuit may comprise (a) a phase detector configured to compare the spread spectrum signal and the recovered clock signal and to produce an unfiltered error signal, and (b) a loop filter configured to filter the unfiltered error signal and to produce the first and second error signals. Thus, the means for comparing may comprise a means for comparing the spread spectrum signal to the recovered clock signal and for producing an unfiltered error signal, and a means for filtering the unfiltered error signal and for producing the first and second error signals. In a still further embodiment, the loop filter may comprise (a) a first loop filter stage configured to produce a wideband filtered error signal, (b) a low pass filter configured to process the wideband filtered error signal and to produce the first error signal (e.g., first error signal 351), and/or (c) a second loop filter stage (e.g., an integrator) configured to process the wideband filtered error signal and to produce the second error signal (e.g., second error signal 352 corresponding to phase differences other than the spread spectrum modulation). Thus, the means for filtering may comprise a means for processing the unfiltered error signal and producing a wideband filtered error signal, a means for processing the wideband filtered error signal and for producing the first error signal, and/or a means for processing the wideband filtered error signal and for producing the second error signal. In further embodiments, the loop filter may comprise first or second order loop filters.

Figure 5A:
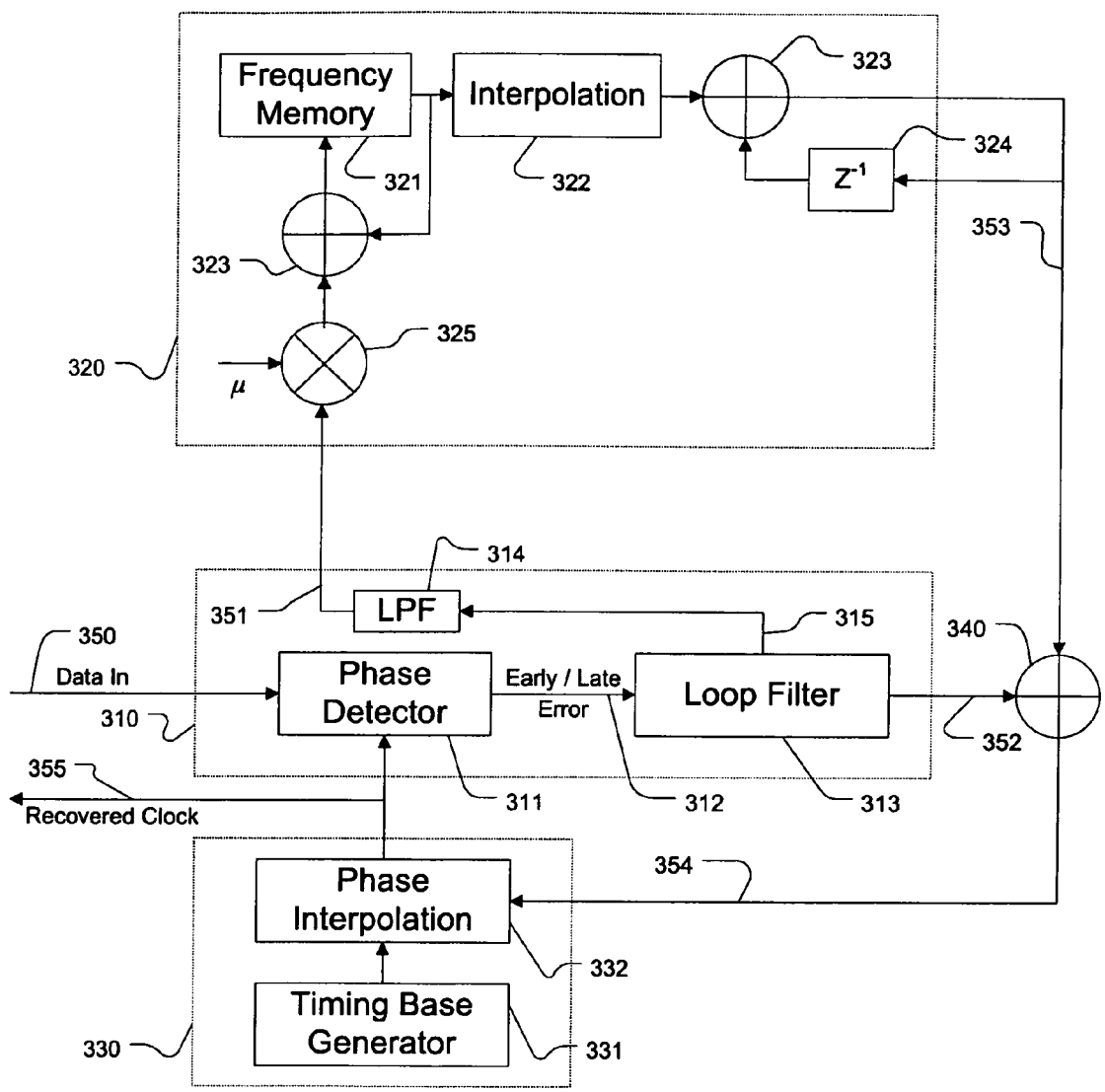
FIG. 5A is a diagram of an exemplary CDR loop according to the present invention.

Referring now to FIG. 5A, error detector 310 may comprise conventional phase detector (or phase-frequency detector) circuit 311, configured to compare the phase of spread spectrum signal 350 and the phase of recovered clock signal 355 and to produce early/late error signal 312. Error detector 310 may further comprise loop filter 313, configured to filter error signal 312 and to produce instantaneous frequency error signal 315 and second error signal 352. Loop filter 313 may comprise first order loop filter 313' (see, e.g., FIG. 5B) or second order loop filter 313" (see, e.g., FIG. 5C). In either loop filter, instantaneous frequency error signal 315 before the final integrator (at the input of adder 362) generally comprises a wideband error signal. Thereafter, low pass filter 314 may filter the wideband error to produce first error signal 351 corresponding to the periodic modulation profile.

In another embodiment, the record and playback unit may be further configured to record the updated memory value by adding the scaled first error signal. In a further embodiment, the record and playback unit may be configured to record N updates based on increments from N samples of the first error signal at intervals of $T_{SSC}/N$, where N is a positive integer, and $T_{SSC}$ is the period of the modulation profile. If N memory units are used to record the profile, then upon convergence of the memory update, the n-th sample, where $0 \leq n \leq N-1$, generally saves a value corresponding to $\delta f * p(nT_{SSC}/N)$. Frequency memory 321 may also comprise a conventional bank or array of latches, one or more shift registers (e.g., two or more shift registers), and/or a buffer such as a FIFO buffer, or other circuitry configured to automatically store and read data at predetermined times. Thus, the means for recording may comprise means for saving updated memory value with the increment of the first error signal and/or means for playing back the third error signal in accordance with the recorded samples.

In a further embodiment, the record and playback unit may further comprise a playback (or read) unit configured to produce the third error signal in accordance with the recorded samples. In still further embodiments, the playback unit may comprise an interpolator configured to interpolate values for the third error signal between the sampled values. Thus, referring again to FIG. 5A, record and playback unit 320 may comprise frequency memory 321, configured to save the updated memory value based on first error signal 351 (e.g., by saving successive increments of first error signal 351), and interpolator 322, configured to produce the third error signal by interpolating values between the samples. Record and playback unit 320 may further comprise multiplier 325 (where multiplier 325 has a gain of μ, described in more detail below), configured to receive the output of low pass filter 314, and adder 326, configured to receive the outputs of multiplier 325 and frequency memory 321, and to provide its output to frequency memory 321.

In another embodiment, the circuit may further comprise an adder configured to add the second and third (predicted modulation profile) error signals. Referring again to FIGS. 4 and 5A, adder 340 may add second error signal 352 (phase differences other than the SSC modulation) to third error signal 353 (phase predicted by estimated SSC modulation profile saved in memory) to produce combined error signal 354. Thus, the circuit or apparatus may comprise a means for adding the second and third error signals. Generally, first, second, and third error signals are analog or multi-bit digital signals.

Figure 5B:
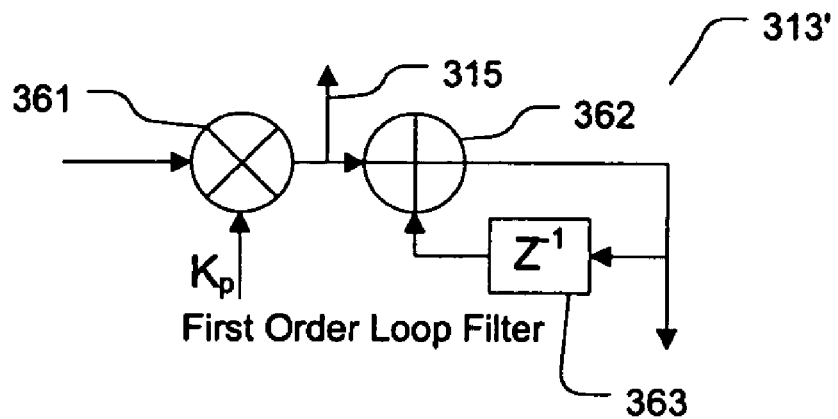
FIG. 5B is a diagram of an exemplary first order loop filter according to the present invention.
Figure 5C:
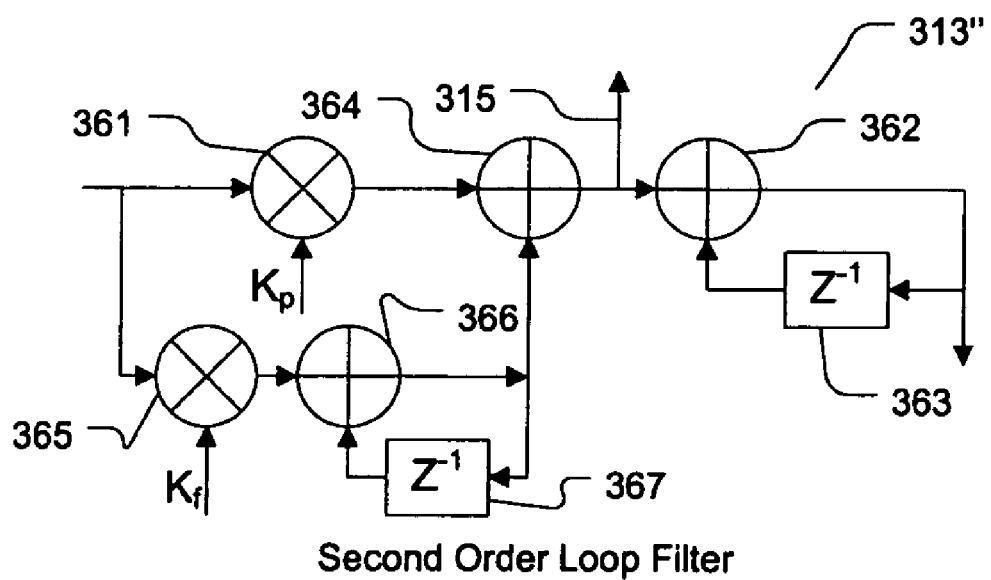
FIG. 5C is a diagram of an exemplary second order loop filter according to the present invention.

Referring now to FIG. 5B, first-order loop filter 313' is shown. A first-order loop filter generally multiplies the early/late error signal (e.g., at multiplier 361) by a proportional gain $K_t$, to produce the instantaneous frequency error signal. Referring now to FIG. 5C, a second-order loop filter is shown. A second-order loop filter generally comprises two paths. The proportional path multiplies the early/late error signal by a proportional gain $K_p$ (e.g., at multiplier 361). In addition, an integral path may multiply the early/late error signal by an integral gain $K_f$ (e.g., at multiplier 365) and then may integrate the scaled error using adder 366 and delay block 367. The error signal paths may then be added back together at adder 364 to produce the instantaneous frequency error signal. For either a first- or second-order loop, the instantaneous frequency error signal may then be integrated using adder 362 and delay block 363. The values of the gain parameters ($K_p$ and/or $K_f$) chosen for the loop filter control the bandwidth of the filter. The size of the loop bandwidth generally determines the range of error signal frequencies that the loop filter will pass.

Exemplary Methods

The present invention further relates to method of clock recovery from a spread spectrum signal having a periodic modulation profile. The method generally include the steps of (a) comparing the spread spectrum signal and a recovered clock signal to produce a first error signal corresponding to the modulation profile and a second error signal corresponding to phase differences other than the modulation, (b) recording values based on the first error signal and producing a third error signal corresponding to a predicted periodic modulation based on the recorded value, and (c) producing the recovered clock signal in response to the second and third error signals.

In one embodiment, the comparing step may comprise (a) comparing the spread spectrum signal to the recovered clock signal and producing an early/late error signal, and (b) filtering the error signal to producing the first and second error signals. In a further embodiment, the filtering step may comprise filtering the error signal to produce an instantaneous frequency error signal. The filtering step may further comprise low pass filtering the instantaneous frequency error signal to produce the first (measured modulation profile) error signal. In addition, the filtering step may comprise the step of integrating the instantaneous frequency error signal to produce the second error signal. The loop filter bandwidth can advantageously be reduced because frequency variation contributed by spread spectrum modulation is handled separately (e.g., by the path including first error signal 351, record and playback unit 320, and third error signal 353).

In another embodiment, the recording step may further comprise recording a plurality of memory updates based on samples of the first error signal corresponding to the periodic modulation profile. The recording step may advantageously comprise recording N samples of the first error signal at intervals of $T_{SSC}/N$, where N is a positive integer, and $T_{SSC}$ is the period of the periodic modulation profile. The frequency $f_{SSC}$ of the modulation profile (where $f_{SSC}=1/T_{SSC}$) may or may not be known precisely at the time of implementation. In most applications (e.g., PCIe and SATA), $f_{SSC}$ is known at the time of implementation. For other applications where $f_{SSC}$ is not known at the time of implementation, an initial estimate of $f_{SSC}$ may be obtained by averaging the instantaneous frequency error signal 315 when the loop filter bandwidth is initially set to a large enough value for tracking purposes (e.g., such that the loop is not optimized for jitter reduction and/or the loop is in a start up stage).

In a further embodiment, the method further comprises producing the third (predicted modulation profile) error signal in accordance with the recorded samples. The method may advantageously include the step of interpolating values for the third error signal between the sampled values (e.g., to produce an error signal at a higher rate, for example at the communication symbol rate, than the recording rate $N*f_{SSC}$). In another embodiment, the method may include the step of adding the second and third error signals prior to producing the recovered clock signal.

As the modulation profile repeats, the values stored in the frequency memory of the record and playback unit will generally converge as illustrated below. The values stored may be represented as $w(nT_{SSC}/1V)$, where $0 \leq n \leq N-1$. The output of the interpolator (e.g., interpolator 322) may be represented as $w(t)$. The instantaneous frequency error signal (e.g., error signal 315) may then be represented in an open loop condition as a function of time $e(t)$ by the equation:

$$e(t)=\delta f^*p(t)-w(t)+n(t); \qquad (2)$$

where $\delta f$ is the frequency deviation of the modulation profile adopted in the received spread spectrum signal, $p(t)$ is the normalized modulation profile adopted in the received spread spectrum signal, and $n(t)$ is the noise component in $e(t)$, which includes the effects of phase noises, phase detector quantization error, and missing data transitions (e.g., because random data is transmitted instead of continuously transitioning data [e.g., 0101 ... 0101]).

The first error signal (e.g., low-pass filtered signal 351) may be represented as a function of time $e_1(t)$ by the equation:

$$e_1(t)=\delta f^*p(t)-w(t)+n_1(t); \qquad (3)$$

where $n_1(t)$ is the low pass filtered noise component, which generally has a very small magnitude because the bandwidth of the low pass filter is much smaller than the symbol rate (for example, a 1 MHz bandwidth for the low pass filter is less than $1/1000^{th}$ of current high speed data communication rates). On the other hand, 1 MHz bandwidth for LPF is generally high enough to include substantially all harmonics of a 33 kHz modulation profile [e.g., the 33 kHz modulation profile specified by the PCIe standard], thus virtually all kinds of modulation profile waveform can pass this LPF undistorted (i.e., the proposed SSC modulation profile estimate method is suitable for virtually all periodic profiles). Since the bandwidth for the low pass filter is high enough to include substantially all harmonics of the modulation profile, $p(t)$ and $w(t)$ are virtually unaffected by the low pass filter.

Over time, the memory storage locations may generally be addressed in wrapped-back manner (e.g., $n=mod(n+1, N)$). This operation exploits knowledge that the modulation profile is a periodic function. Thus, as the memory is updated on further repetitions of the modulation profile, the new values stored in the frequency memory of the record and playback unit may be represented as discrete samples of $w_{new}(t)$ at $nT_{SSC}/N$, where $0 \leq n \leq N-1$, where $w_{new}(t)$ is updated from the old waveform saved in memory by:

$$w_{new}(t)=w(t)+\mu e_1(t); \qquad (4)$$

where $\mu$ is the update step size. The update equation of $w(t)$ further filters out the noise component in $e_1(t)$ because $n_1(t)$ is generally random and does not have a periodic pattern. The equivalent bandwidth of this low pass averaging is in the range of kilohertz and generally dependent on the choice of the update step size $\mu$. Combining equations (3) and (4), based on adaptive filtering theory, $w(t)$ is generally expected to converge to $\delta f^*p(t)$. Because the modulation profile is a periodic function, and wrapped-back addressing the memory storage locations forms a continuous sequence of the estimate of the modulation profile, the low pass filtering operation on $e(t)$ may be implemented with zero delay.

When the CDR loop is closed, the above analysis remains valid, given that the update loop bandwidth is small with respect to the update rate. A person skilled in the art may therefore choose a proper step size $\mu$.

If the frequency $f_{SSC}$ of the modulation profile is not known at the time of design and/or implementation, but can be estimated, the relatively small estimation error can generally be tracked by continuously updating the frequency memory of the record and playback unit. Alternatively, an estimate of the frequency $f_{SSC}$ (or equivalently its reciprocal $T_{SSC}$) may be calculated according to the equation:

$$T_{SSC}' = T_{SSC}' + \mu_{Tssc} e_{Tssc};$$

where $\mu_{T_{ssc}}$ is the Tssc update step size, and $e_{T_{ssc}}$ is update data generated by obtaining the an early/late indication by comparing the sign of error signal $e_1(t)$ with the sign of the instantaneous slope of the frequency modulation profile stored in the frequency memory.

Figure 6:
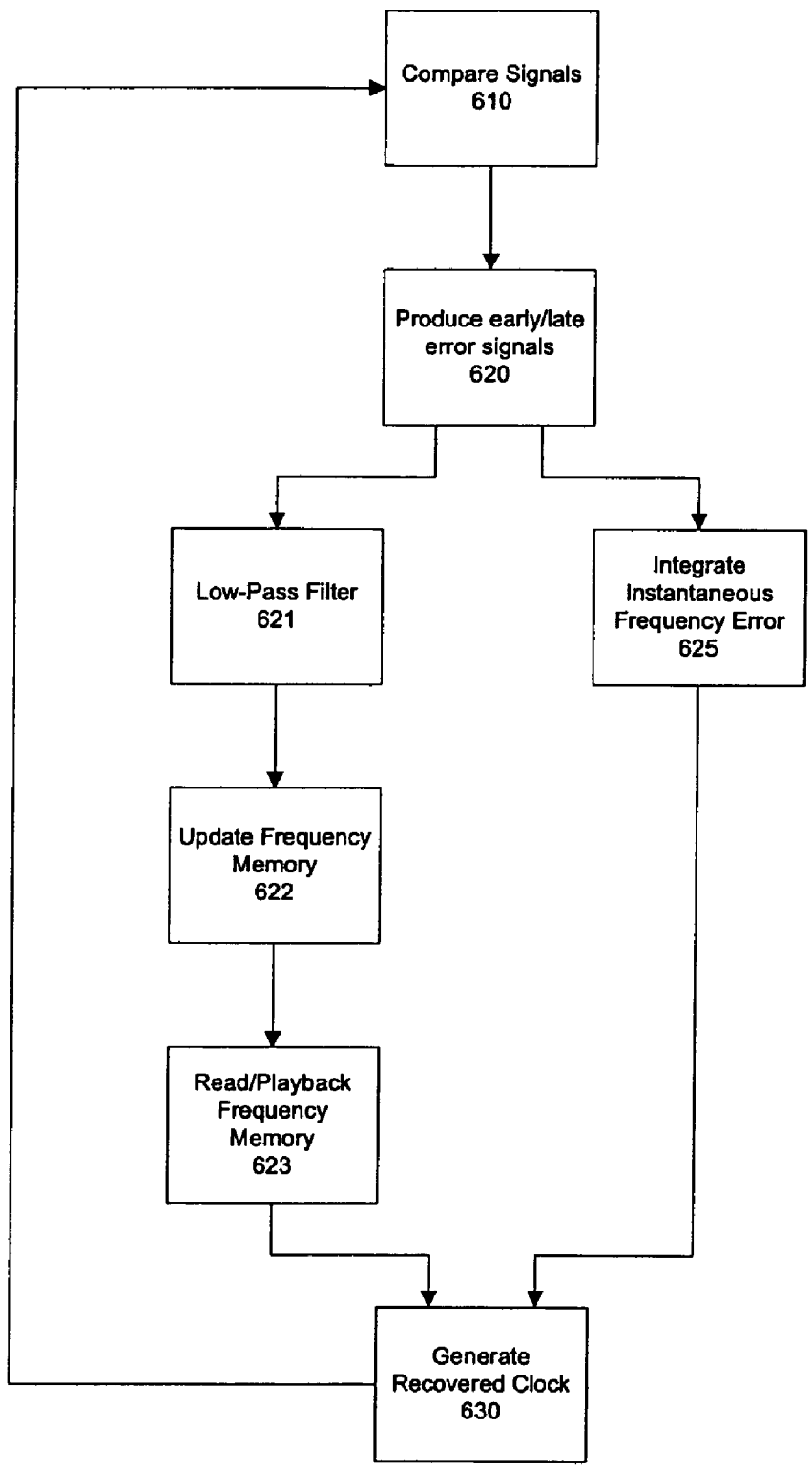
FIG. 6 is a diagram of an exemplary clock recovery method according to the present invention.

Referring now to FIG. 6, the method may comprise the step of comparing (step 610) the spread spectrum signal to the recovered clock signal and producing an early/late error signal, and filtering (step 620) the early/late error signal to produce an instantaneous frequency error signal. The method may further include the step of low-pass filtering (step 621) the instantaneous frequency error signal to produce a first error signal corresponding to the modulation profile. In addition, the method may include the step of integrating (step 625) the instantaneous frequency error signal to produce a second error signal corresponding to phase differences other than SSC modulation profile.

At step 622, the method may include updating and storing the modulation profile error signal, then at step 623 reading the stored values to play back an error signal corresponding to the periodic modulation profile. Finally, the method may include the step of generating (630) the recovered clock signal in response to the played-back modulation profile error signal and/or the narrowband filtered error signal.

The System and Network

In a further aspect, the invention relates to a receiver comprising a receiving port configured to receive the spread spectrum signal (e.g., containing serial data), and the spread spectrum clock recovery circuit of the present invention. In another aspect, the invention relates to a transceiver, including the receiver and a transmitter configured to transmit serial data (e.g., to a network). The receiver and transceiver may each be embodied on a single integrated circuit.

In another embodiment, the invention relates to a system (e.g. a device comprising one or more integrated circuit chips, packaging for such chips, circuit boards including such packaged chips, and/or housing enclosing such circuit boards) for transferring data on or across a network, including (a) the transceiver, (b) at least one transmitter port communicatively coupled to the transmitter for transmitting serial data to an external receiver, and (c) at least one receiver port communicatively coupled to the receiver for receiving the data stream.

A further aspect of the invention concerns a network, comprising (a) a plurality of systems including the spread spectrum clock recovery apparatus, communicatively coupled to each other; and (b) a plurality of storage or communications devices, wherein each storage or communications device is communicatively coupled to one of the systems. The network may be any kind of known network, such as those communicating via a standard storage bus (e.g., PCIe and SATA), a storage network (e.g., RAID array), Ethernet, or wireless network. The network may include any known storage or communications device.

Various exemplary implementations of the present invention are shown in FIGS. 9A-9G. Referring now to FIG. 7A, the present invention can be implemented in a hard disk drive (HDD) 400. The present invention may implement either or both signal processing and/or control circuits, which are generally identified in FIG. 7A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM), and/or other suitable electronic data storage.

Figure 7B:
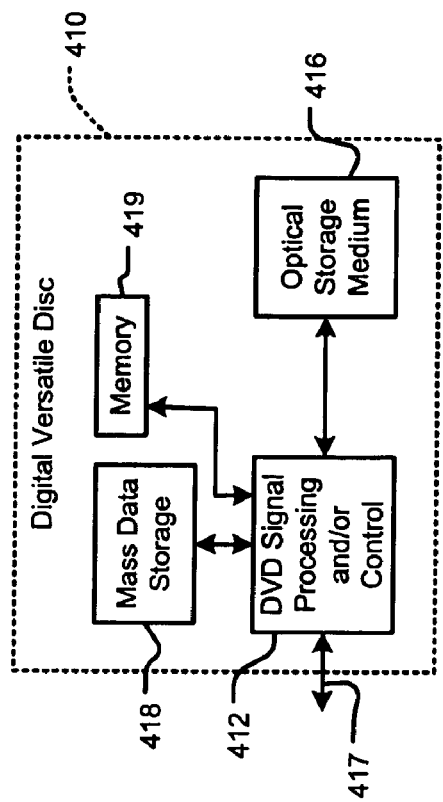
FIG. 7B is a diagram of an exemplary digital versatile disc (DVD) player.
Figure 7A:
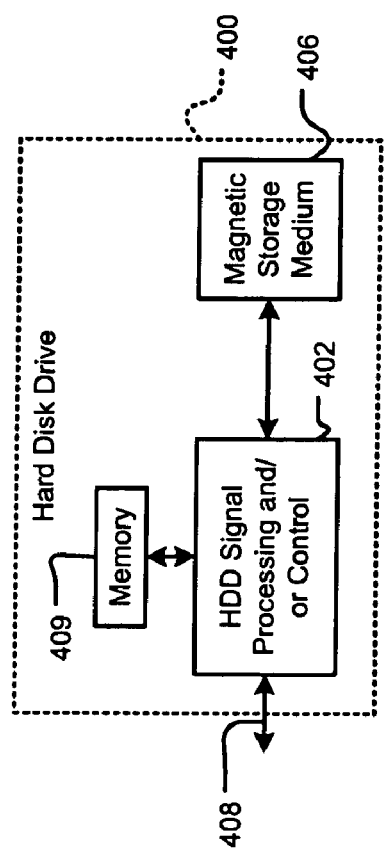
FIG. 7A is a diagram of an exemplary hard disk drive.

Referring now to FIG. 7B, the present invention can be implemented in a digital versatile disc (DVD) drive 410. The present invention may implement either or both signal processing and/or control circuits, which are generally identified in FIG. 7B at 412, and/or mass data storage of the DVD drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 7A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 7D:
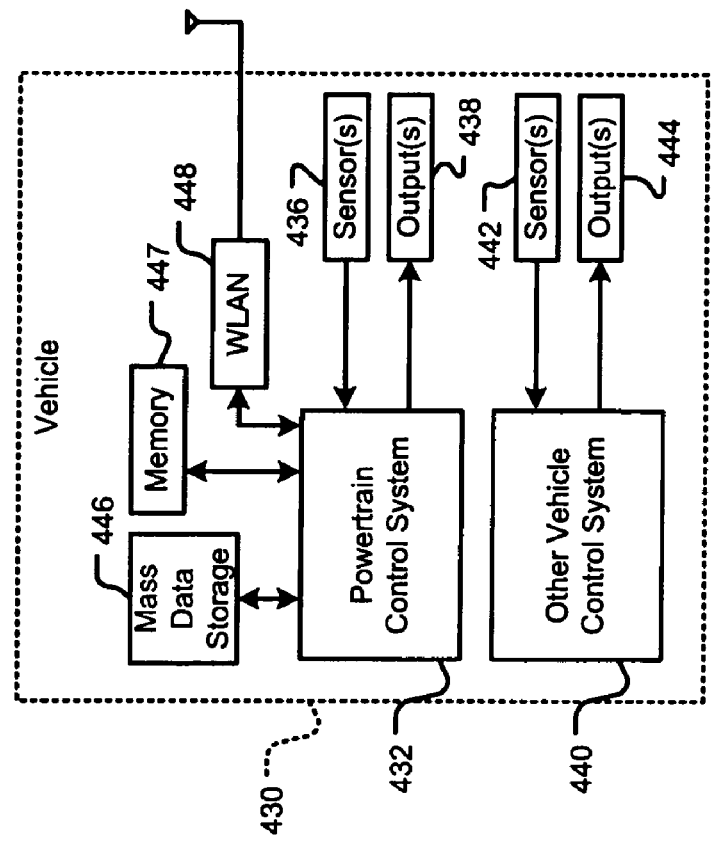
FIG. 7D is a diagram of an exemplary vehicle control system.
Figure 7C:
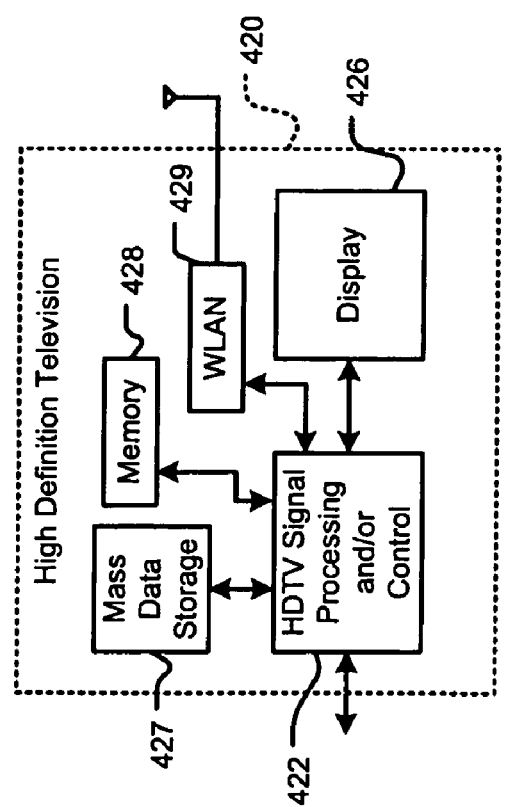
FIG. 7C is a diagram of an exemplary high definition television (HDTV).

Referring now to FIG. 7C, the present invention can be implemented in a high definition television (HDTV) 420. The present invention may implement either or both signal processing and/or control circuits, which are generally identified in FIG. 7E at 422, a WLAN interface and/or mass data storage of the HDTV 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 7A and/or at least one DVD may have the configuration shown in FIG. 7B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 7D, the present invention implements a control system of a vehicle 430, a WLAN interface, and/or mass data storage of the vehicle control system. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices (for example, hard disk drives [HDDs] and/or DVDs). At least one HDD may have the configuration shown in FIG. 7A and/or at least one DVD may have the configuration shown in FIG. 7B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 7E:
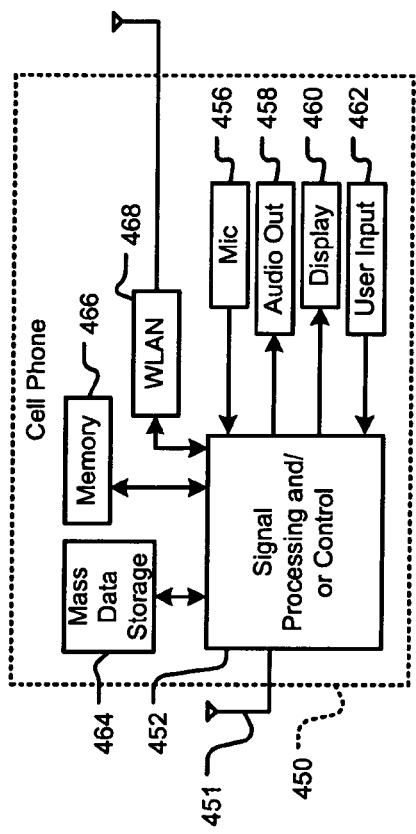
FIG. 7E is a diagram of an exemplary cellular or mobile phone.

Referring now to FIG. 7E, the present invention can be implemented in a cellular phone 450 that may include a cellular antenna 451. The present invention may implement either or both signal processing and/or control circuits, which are generally identified in FIG. 7E at 452, a WLAN interface and/or mass data storage of the cellular phone 450. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices (for example, hard disk drives [HDDs] and/or DVDs). At least one HDD may have the configuration shown in FIG. 7A and/or at least one DVD may have the configuration shown in FIG. 7B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 7F:
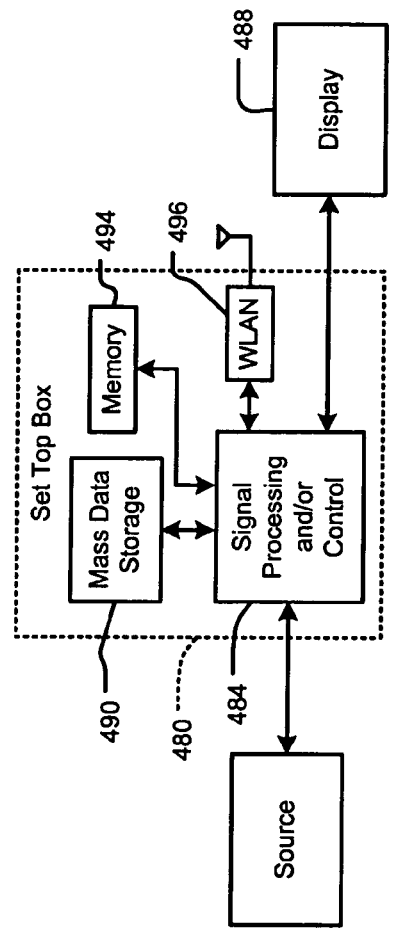
FIG. 7F is a diagram of an exemplary television set top box.

Referring now to FIG. 7F, the present invention can be implemented in a set top box 480. The present invention may implement either or both signal processing and/or control circuits, which are generally identified in FIG. 7F at 484, a WLAN interface and/or mass data storage of the set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices (for example, hard disk drives [HDDs] and/or DVDs). At least one HDD may have the configuration shown in FIG. 7A and/or at least one DVD may have the configuration shown in FIG. 7B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 7G:
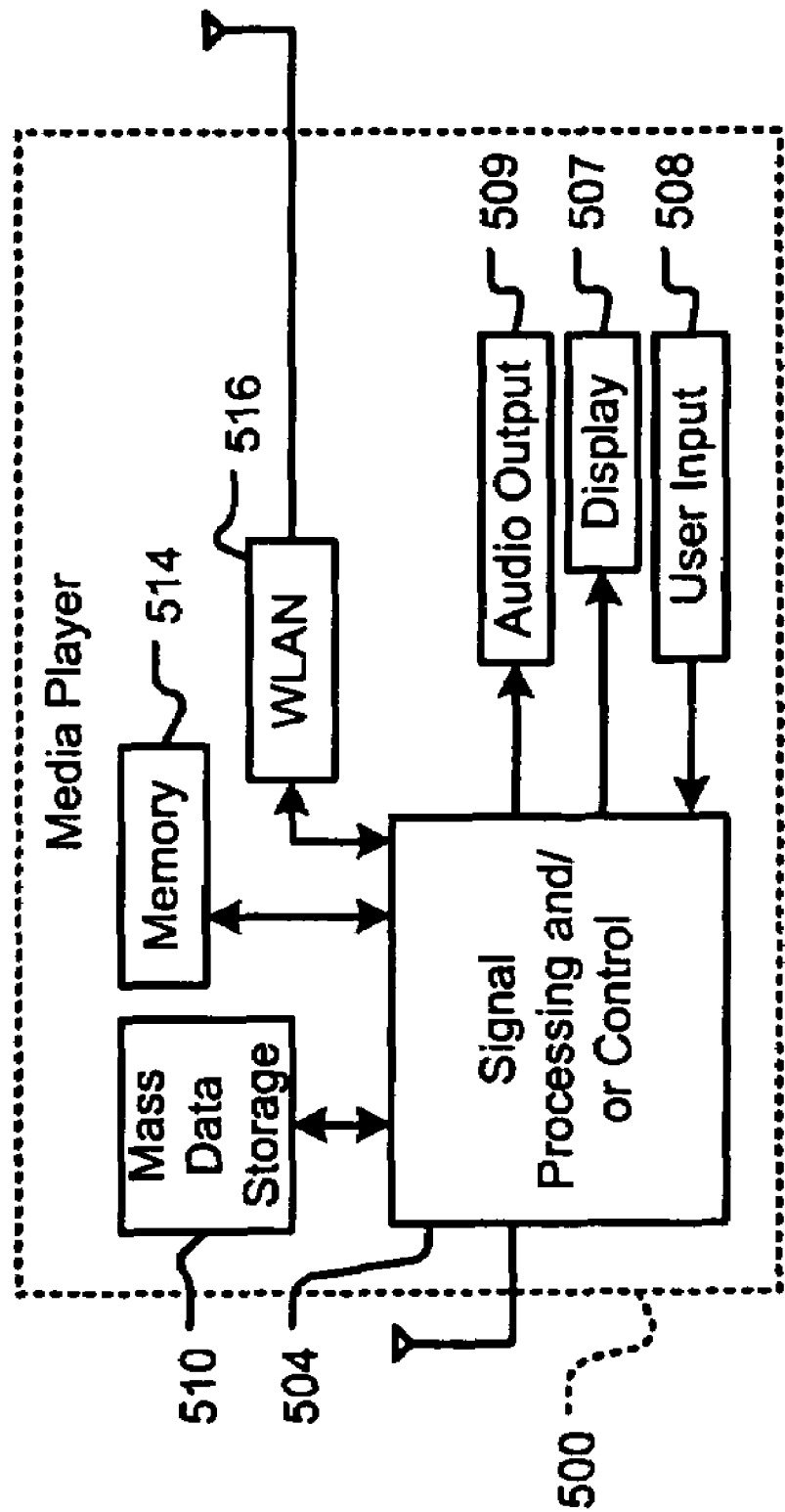
FIG. 7G is a diagram of an exemplary portable media player.

Referring now to FIG. 7F, the present invention can be implemented in a media player 500. The present invention may implement either or both signal processing and/or control circuits, which are generally identified in FIG. 7G at 504, a WLAN interface and/or mass data storage of the media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 7A and/or at least one DVD may have the configuration shown in FIG. 7B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

CONCLUSION/SUMMARY

Thus, the present invention provides a circuit, method, apparatus, system, and network for recovering a clock from a spread spectrum signal having a periodic modulation profile. The present invention advantageously provides good noise resistance at high data rates using conventional loop filter techniques, while accurately tracking phase and frequency changes due to spread spectrum modulation of the data signal frequency by estimating this periodic term and compensating its effect separately.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit for clock recovery, said circuit comprising:
an error detector circuit configured to compare a spread spectrum signal and a recovered clock signal, said spread spectrum signal having a center frequency modulated with a periodic modulation profile, said error detector circuit producing a first error signal corresponding to said periodic modulation profile and a second error signal corresponding to one or more phase differences other than said periodic modulation profile;
a record and playback circuit configured to record a value based on said first error signal and produce a third error signal corresponding to a predicted periodic modulation of said spread spectrum signal based at least in part on said recorded value; and
a signal generator configured to produce said recovered clock signal in response to said second and third error signals.

2. The circuit of claim 1, wherein said error detector circuit comprises:
a phase detector configured to compare said spread spectrum signal and said recovered clock signal and produce an unfiltered error signal; and
a loop filter configured to filter said unfiltered error signal and to produce said first and second error signals.

3. The circuit of claim 2, wherein said loop filter comprises a first stage configured to receive said unfiltered error signal and produce a wideband error signal.

4. The circuit of claim 3, wherein said loop filter further comprises a second loop filter stage configured to receive said wideband error signal and to produce said second error signal.

5. The circuit of claim 3, wherein said loop filter further comprises a low pass filter configured to receive said wideband error signal and to produce said first error signal.

6. The circuit of claim 2, wherein said loop filter comprises a first order loop filter.

7. The circuit of claim 2, wherein said loop filter comprises a second order loop filter.

8. The circuit of claim 1, wherein said record and playback circuit is further configured to record a plurality of values to a frequency memory, said values based on samples of said first error signal corresponding to said periodic modulation profile.

9. The circuit of claim 8, wherein said record and playback circuit is further configured to record N values to said frequency memory, said values based on samples of said first error signal at intervals of $T_{SSC}/N$, where N is an integer of at least 2, and $T_{SSC}$ is the period of said modulation profile.

10. The circuit of claim 8, wherein said record and playback circuit further comprises a playback unit configured to produce said third error signal in accordance with said recorded samples.

11. The circuit of claim 10, wherein said playback unit comprises an interpolator configured to provide values for said third error signal between said sampled values.

12. The circuit of claim 1 further comprising an adder configured to add said second and third error signals.

13. A method for clock recovery from a spread spectrum signal having a center frequency modulated with a periodic modulation profile, said method comprising the steps of:
comparing said spread spectrum signal to a recovered clock signal to produce a first error signal corresponding to said periodic modulation profile and a second error signal corresponding to one or more phase differences other than said periodic modulation profile;
recording values based on said first error signal and producing a third error signal corresponding to a predicted periodic modulation of said spread spectrum signal based at least in part on recorded values; and
producing said recovered clock signal in response to said second and third error signals.

14. The method of claim 13, wherein said comparing step further comprises:
comparing said spread spectrum signal to said recovered clock signal and producing an unfiltered error signal; and
filtering said unfiltered error signal and producing said first and second error signals.

15. The method of claim 14, wherein said filtering step comprises filtering said unfiltered error signal to produce a wideband error signal.

16. The method of claim 15, wherein said filtering step further comprises filtering said wideband error signal to produce said second error signal.

17. The method of claim 15, wherein said filtering step further comprises low pass filtering said wideband error signal produce said first error signal.

18. The method of claim 13, wherein said recording step further comprises recording a plurality of said values to said frequency memory, said values based on samples of said first error signal corresponding to said periodic modulation profile.

19. The method of claim 18, wherein said recording step further comprises recording N values to said frequency memory, said values based on samples of said first error signal at intervals of $T_{SSC}/N$, where N is an integer of at least 2, and $T_{SSC}$ is a period of said periodic modulation profile.

20. The method of claim 18, further comprising producing said third error signal in accordance with said recorded values.

21. The method of claim 20, further comprising interpolating values for said third error signal between said recorded values.

22. The method of claim 13, further comprising adding said second and third error signals prior to producing said recovered clock signal.

23. An apparatus for clock recovery from a spread spectrum signal, said apparatus comprising:
means for comparing a spread spectrum signal and a recovered clock signal, said spread spectrum signal having a center frequency modulated with a periodic modulation profile;
means for producing a first error signal corresponding to said periodic modulation profile and a second error signal corresponding to one or more phase differences other than said periodic modulation profile;

means for recording values to a frequency memory, said values based on said first error signal and for producing a third error signal corresponding to a predicted periodic modulation based at least in part on values recorded in said frequency memory; and means for generating said recovered clock signal in response to said second and third error signals.

24. A receiver, configured to receive serial data from a network, and comprising the clock recovery circuit of claim 1.

25. A transceiver, comprising:

the receiver of claim 24; and a transmitter configured to transmit serial data to said network.

26. The transceiver of claim 25, embodied on a single integrated circuit.

27. A system for transferring data on or across a network, comprising:

the transceiver of claim 25;

at least one transmitter port communicatively coupled to said transmitter for transmitting serial data to an external receiver; and at least one receiver port communicatively coupled to said receiver for receiving said data stream.

28. A network, comprising:

a plurality of the systems of claim 27, communicatively coupled to each other; and a plurality of storage or communications devices, each of said storage or communications devices being communicatively coupled to one of said systems.

29. A transceiver, comprising:

means for transmitting serial data to a network; and means for receiving a serial data stream from said network, said means comprising the clock recovery apparatus of claim 23.

* * * * *